United States Patent
Kula et al.

(10) Patent No.: US 11,121,258 B2
(45) Date of Patent: Sep. 14, 2021

(54) TRANSISTORS COMPRISING TWO-DIMENSIONAL MATERIALS AND RELATED SEMICONDUCTOR DEVICES, SYSTEMS, AND METHODS

(71) Applicant: Micron Technology, Inc., Boise, ID (US)

(72) Inventors: Witold Kula, Gilroy, CA (US); Gurtej S. Sandhu, Boise, ID (US); John A. Smythe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 68 days.

(21) Appl. No.: 16/113,113

(22) Filed: Aug. 27, 2018

(65) Prior Publication Data

US 2020/0066917 A1  Feb. 27, 2020

(51) Int. Cl.
  *H01L 29/786* (2006.01)
  *H01L 29/24* (2006.01)
  *H01L 27/105* (2006.01)
  *H01L 21/02* (2006.01)
  *H01L 29/66* (2006.01)

(52) U.S. Cl.
  CPC .. *H01L 29/78642* (2013.01); *H01L 21/02178* (2013.01); *H01L 21/02488* (2013.01); *H01L 21/02568* (2013.01); *H01L 27/1052* (2013.01); *H01L 29/24* (2013.01); *H01L 29/66969* (2013.01); *H01L 29/78696* (2013.01); *H01L 21/0262* (2013.01)

(58) Field of Classification Search
  CPC ..... H01L 2924/13085; H01L 29/78696; H01L 29/78648; H01L 29/78645; H01L 29/78642; H01L 29/66969; H01L 29/66484; H01L 29/24; H01L 27/1052; H01L 21/02568; H01L 21/02488; H01L 21/02178
  See application file for complete search history.

(56) References Cited

U.S. PATENT DOCUMENTS 8,969,154 B2 * 3/2015 Sandhu ............ H01L 29/78642
                                                    438/268
9,177,872 B2 * 11/2015 Sandhu ............ H01L 27/10876
(Continued)

FOREIGN PATENT DOCUMENTS

KR    10-0982952 B1    9/2010
WO   WO-2014017592 A1 * 1/2014 ............ B82Y 10/00
(Continued)

OTHER PUBLICATIONS

International Search Report from International Application No. PCT/US2019/046158, dated Dec. 6, 2019, 3 pages.
(Continued)

*Primary Examiner* — Earl N Taylor
(74) *Attorney, Agent, or Firm* — TraskBritt (57) ABSTRACT

A transistor comprising a channel region on a material is disclosed. The channel region comprises a two-dimensional material comprising opposing sidewalls and oriented perpendicular to the material. A gate dielectric is on the two-dimensional material and gates are on the gate dielectric. Semiconductor devices and systems including at least one transistor are disclosed, as well as methods of forming a semiconductor device.

34 Claims, 4 Drawing Sheets

(56) References Cited

U.S. PATENT DOCUMENTS

| | | | |
|---|---|---|---|
| 9,331,088 B2* | 5/2016 | Takaki | H01L 27/2454 |
| 9,343,507 B2* | 5/2016 | Takaki | H01L 29/1033 |
| 9,449,924 B2* | 9/2016 | Takaki | H01L 27/11548 |
| 9,548,394 B2* | 1/2017 | Das | H01L 29/78648 |
| 9,553,199 B2* | 1/2017 | Hou | H01L 29/41733 |
| 9,893,188 B2* | 2/2018 | Ho | H01L 21/02568 |
| 9,899,501 B2* | 2/2018 | Pourtois | H01L 29/78648 |
| 10,032,908 B1* | 7/2018 | Ratnam | H01L 27/249 |
| 10,283,590 B2* | 5/2019 | Yeh | H01L 29/1033 |
| 10,741,646 B2* | 8/2020 | Yeh | H01L 27/0886 |
| 2003/0062574 A1* | 4/2003 | Hsieh | H01L 29/78609 257/379 |
| 2009/0045455 A1* | 2/2009 | Seol | H01L 29/4234 257/324 |
| 2009/0079040 A1* | 3/2009 | Schultz | H01L 21/02433 257/632 |
| 2009/0166686 A1* | 7/2009 | Hunt | B82Y 10/00 257/288 |
| 2010/0051897 A1* | 3/2010 | Chen | H01L 29/78606 257/9 |
| 2010/0155810 A1* | 6/2010 | Kim | H01L 29/792 257/316 |
| 2010/0181610 A1* | 7/2010 | Kim | H01L 27/11582 257/314 |
| 2010/0320528 A1* | 12/2010 | Jeong | H01L 27/11582 257/324 |
| 2011/0076819 A1* | 3/2011 | Kim | H01L 27/11556 438/279 |
| 2012/0001247 A1* | 1/2012 | Alsmeier | H01L 29/7889 257/316 |
| 2012/0001249 A1* | 1/2012 | Alsmeier | H01L 27/1157 257/319 |
| 2012/0001250 A1* | 1/2012 | Alsmeier | H01L 27/11551 257/319 |
| 2012/0161094 A1* | 6/2012 | Huo | H01L 27/249 257/4 |
| 2012/0175594 A1* | 7/2012 | Chen | H01L 29/66742 257/29 |
| 2012/0286244 A1* | 11/2012 | Chiu | H01L 29/42364 257/40 |
| 2013/0088283 A1* | 4/2013 | Lee | H01L 29/78645 327/534 |
| 2013/0187220 A1* | 7/2013 | Surthi | H01L 29/66666 257/329 |
| 2014/0252415 A1* | 9/2014 | Nayfeh | H01L 29/1606 257/194 |
| 2014/0273361 A1* | 9/2014 | Arnold | H01L 29/66015 438/158 |
| 2015/0194536 A1* | 7/2015 | Chen | H01L 29/4908 257/29 |
| 2015/0325672 A1* | 11/2015 | Chen | H01L 29/66045 438/157 |
| 2016/0043234 A1* | 2/2016 | Alper | H01L 29/0676 327/537 |
| 2016/0064557 A1* | 3/2016 | Xiao | H01L 29/78645 257/329 |
| 2016/0118404 A1* | 4/2016 | Peng | H01L 27/1159 257/295 |
| 2016/0141336 A1* | 5/2016 | Karda | H01L 29/7827 257/29 |
| 2016/0313276 A1* | 10/2016 | Han | G01N 33/0075 |
| 2017/0098716 A1* | 4/2017 | Li | H01L 29/78648 |
| 2017/0175258 A1* | 6/2017 | Robinson | C23C 16/305 |
| 2017/0179263 A1* | 6/2017 | Pourtois | H01L 29/778 |
| 2017/0219519 A1* | 8/2017 | Chen | G01R 27/02 |
| 2017/0287929 A1* | 10/2017 | Kim | H01L 28/00 |
| 2018/0012962 A1* | 1/2018 | Yeh | H01L 29/66969 |
| 2018/0112962 A1 | 1/2018 | Yeh et al. | |
| 2018/0061665 A1* | 3/2018 | Meade | H01L 21/477 |
| 2018/0197988 A1* | 7/2018 | Ratnam | H01L 27/2454 |
| 2018/0204953 A1* | 7/2018 | Zhu | H01L 29/267 |
| 2019/0326399 A1* | 10/2019 | Yeh | H01L 29/778 |
| 2019/0346403 A1* | 11/2019 | Ahn | G01N 33/5438 |
| 2020/0066917 A1* | 2/2020 | Kula | H01L 27/10805 |

FOREIGN PATENT DOCUMENTS

| | | | |
|---|---|---|---|
| WO | 2016/200971 A1 | 12/2016 | |
| WO | 2017/111869 A1 | 6/2017 | |
| WO | 2017/210264 A1 | 12/2017 | |
| WO | 2018/039645 A1 | 3/2018 | |
| WO | WO-2018055005 A1 * | 3/2018 | C09D 11/52 |

OTHER PUBLICATIONS

International Written Opinion from International Application No. PCT/US2019/046158, dated Dec. 6, 2019, 8 pages.

* cited by examiner

TRANSISTORS COMPRISING TWO-DIMENSIONAL MATERIALS AND RELATED SEMICONDUCTOR DEVICES, SYSTEMS, AND METHODS

TECHNICAL FIELD

Embodiments disclosed herein relate to semiconductor devices and semiconductor fabrication. More particularly, embodiments of the disclosure relate to transistors including two-dimensional (2D) materials having improved crystalline quality, semiconductor devices and systems including the transistors, and methods of forming the transistors.

BACKGROUND

Transistors are utilized in a variety of semiconductor devices. Field effect transistors (FETs) include a channel region between a pair of source/drain regions and one or more gates configured to electrically connect the source/drain regions to one another through the channel region. Vertical FETs (VFETs) have channel regions that are generally perpendicular to a primary surface of a substrate on which the transistors are formed. Polycrystalline silicon is conventionally used as a material of the channel region in the transistors. 2D materials have also been investigated for use as the channel material due to their large band gap and good mobility properties compared to polycrystalline silicon. However, growing bulk amounts (e.g., a large area) of the 2D material is problematic because the resulting 2D material does not exhibit a good quality (e.g., has crystalline defects). The crystalline defects, such as interstitial and vacancy defects, affect the electrical characteristics of a semiconductor device including the 2D material. To reduce the crystalline defects, the 2D material may be heated after formation, such as by a thermal anneal process. However, the anneal temperature undesirably affects exposed components of the semiconductor device. Forming a high quality 2D material at a temperature below the anneal temperature does not achieve the desired crystalline quality. Forming the 2D material on the vertical FET may also be difficult due to topography of the vertical FET.

DETAILED DESCRIPTION

Transistors having a 2D material of high quality are disclosed, as are semiconductor devices (e.g., memory cells) and systems including the transistors and methods of forming the semiconductor devices. The 2D material of the transistor functions as a channel region and is formed on a crystalline aluminum oxide material on a substrate. The channel region includes two portions of the 2D material separated from one another. The 2D material of the transistor is a single crystal material and the transistor exhibits a higher quality (e.g., reduced crystalline defects) compared to a conventional transistor where the 2D material is formed directly on the substrate or other material.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "crystalline aluminum oxide" means and includes a trigonal single crystal form of aluminum oxide ($AlO_x$), such as a single crystal form of aluminum oxide ($Al_2O_3$).

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. In some embodiments, the substrate is a silicon-based substrate, such as a silicon-based material.

As used herein, the terms "two-dimensional material" or "2D material" mean and include a crystalline material formed of and including a single (e.g., only one) monolayer, or at most two monolayers or three monolayers, of units (e.g., atoms, molecules) bonded together through intramolecular forces (e.g., covalent bonds). Stated another way, a 2D material may be characterized as a crystalline material comprising about three or fewer monolayers bonded together though intramolecular forces.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Conventional techniques of forming the materials of the transistor described herein include, but are not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art.

Figure 1A:
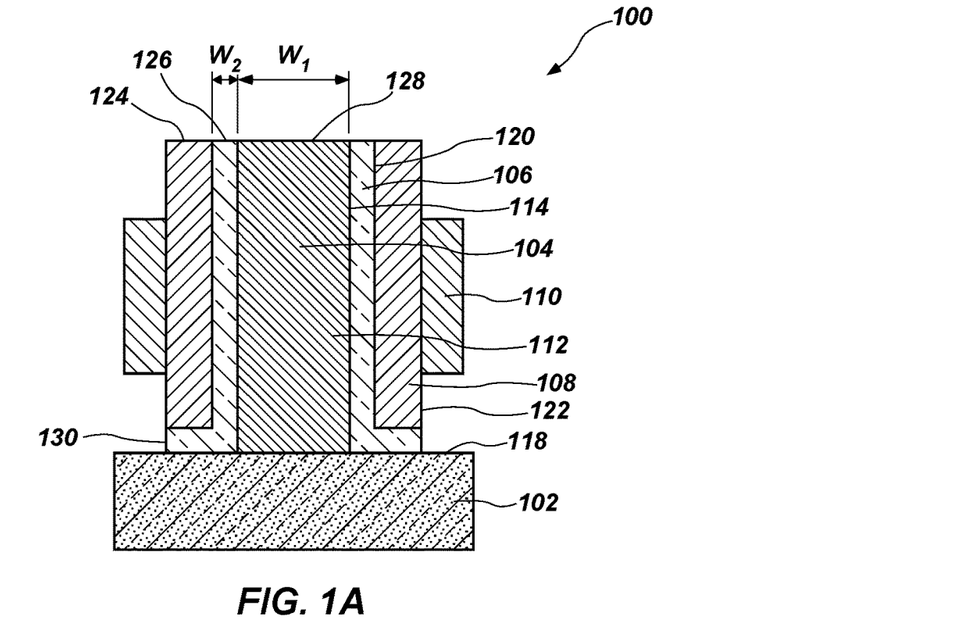
FIGS. 1A and 1B are cross-sectional views of transistors in accordance with embodiments of the disclosure.
Figure 1B:
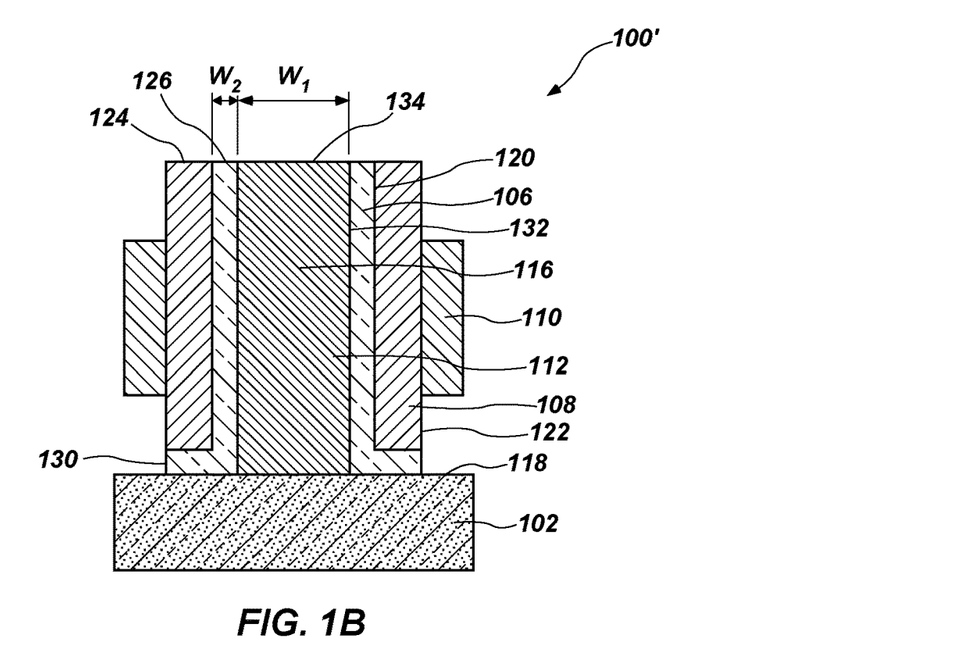

The transistor 100 includes a metal 102 on a substrate (not shown), a crystalline aluminum oxide 104 over the metal 102, a 2D material 106 adjacent to the crystalline aluminum oxide 104, a gate dielectric 108 adjacent to the 2D material 106, and gates 110 adjacent to the gate dielectric 108, as shown in FIG. 1A. In some embodiments, the transistor 100 is a vertical FET (VFET). In other embodiments, the transistor 100 is a fin FET (FINFET). The crystalline aluminum oxide 104 is configured as a pillar 112, upon sidewalls 114 of which the 2D material 106 is formed. The 2D material 106 functions as a channel region of the transistor 100. The 2D material 106 is a single monolayer or at most two monolayers or three monolayers in width and provides sufficient band gap and electron mobility properties at this width. The 2D material 106 is selected such that a lattice constant of the 2D material 106 is within about ±5% of a multiple of the lattice constant or bond length of that of the crystalline aluminum oxide 104. While FIG. 1A illustrates the transistor 100 as including the crystalline aluminum oxide 104, the crystalline aluminum oxide 104 may be sacrificial and may not be present, as shown in transistor 100' of FIG. 1B. When the crystalline aluminum oxide 104 is sacrificial, a dielectric material 116 is present in the transistor 100, as shown in FIG. 1B. The dielectric material 116 in the transistor 100' of FIG. 1B is present in place of the crystalline aluminum oxide 104 of the transistor 100 in in FIG. 1A.

As shown in FIG. 1A, the crystalline aluminum oxide 104 extends vertically from a top surface 118 of the metal 102 and is oriented perpendicular to the metal 102. The crystalline aluminum oxide 104 has a substantially greater width $W_1$ than a width $W_2$ of the 2D material 106. The width $W_2$ may range from about 1 nm to about 4 nm, and the width $W_1$ may range from about 5 nm to about 10 nm. The 2D material 106 is laterally adjacent to the crystalline aluminum oxide 104 and directly on the sidewalls 114 of the crystalline aluminum oxide 104. The 2D material 106 is in direct contact with the crystalline aluminum oxide 104 and extends along a length of the sidewalls 114 of the crystalline aluminum oxide 104 and along a portion of the top surface 118 of the metal 102. The crystalline aluminum oxide 104 is between opposing portions of the 2D material 106. The gate dielectric 108 is laterally adjacent to the 2D material 106 and directly on sidewalls 120 of the 2D material 106. The gate dielectric 108 is in direct contact with the 2D material 106 and extends along a length of the sidewalls 120 of the 2D material 106. The gates 110 are laterally adjacent to the gate dielectric 108 and directly on sidewalls 122 of the gate dielectric 108. The gates 110 are in direct contact with the gate dielectric 108 and extend along a portion of a length of the gate dielectric 108. Top surfaces 124, 126, 128, respectively, of the gate dielectric 108, the 2D material 106, and the crystalline aluminum oxide 104 are substantially coplanar, and lateral edges 130 of the 2D material 106 and the sidewalls 122 of the gate dielectric 108 are substantially aligned.

The crystalline aluminum oxide 104 is formed of a single crystalline form of $AlO_x$, such as single crystal $Al_2O_3$, and functions as a seed material (e.g., a template material) for the 2D material 106. The crystalline aluminum oxide 104 is compatible with conventional semiconductor fabrication techniques. The crystalline aluminum oxide 104 functions as a nucleation site for the 2D material 106. In some embodiments, the crystalline aluminum oxide is $Al_2O_3$ having a hexagonal crystal structure or a rhombohedral crystal structure. The crystalline aluminum oxide 104 is an insulative material and, therefore, may be sacrificial or may be present in the transistor 100.

Gallium nitride, aluminum nitride, boron nitride, graphene, combinations thereof, or combinations with crystalline aluminum oxide may also be used as the seed material (e.g., the template material).

The 2D material 106 is a single crystal material exhibiting a high band gap and a high electron mobility, and is configured to function as a channel region of the transistor 100 at the width $W_1$ of from about one monolayer of atoms to about three monolayers of atoms. In cross-section, two portions of the 2D material 106 (e.g., two portions of the channel region) are present on opposing sidewalls 114 of the crystalline aluminum oxide 104. As shown in cross-section, each portion of the 2D material 106 is configured as a substantially L-shaped portion. Each portion comprises the substantially L-shape and is laterally adjacent to and in direct contact with the sidewalls 114 of the crystalline aluminum oxide 104. The 2D material 106 may, for example, be configured in a cylindrical shape surrounding the pillar 112, with the 2D material 106 present as a substantially contiguous material around the pillar 112. The 2D material 106 includes, but is not limited to, a transition metal dichalcogenide (TMDC), graphene, graphene oxide, stanene, phosphorene, hexagonal boron nitride (h-BN), borophene, silicone, graphyne, germanene, germanane, a 2D supracrystal, or combinations thereof. The TMDC has a chemical formula of MX, such as $MX_2$, where M is a transition metal and X is a chalcogen, e.g., sulfur (S), selenium (Se), or tellurium (Te). The transition metal may include, but is not limited to, molybdenum (Mo), tungsten (W), niobium (Nb), zirconium (Zr), hafnium (Hf), rhenium (Re), platinum (Pt), titanium (Ti), tantalum (Ta), vanadium (V), cobalt (Co) cadmium (Cd), or chromium (Cr). By way of example only, the 2D material includes, but is not limited to, molybdenum sulfide ($MoS_2$), molybdenum selenide ($MoSe_2$), molybdenum telluride ($MoTe_2$), tungsten sulfide ($WS_2$), tungsten selenide ($WSe_2$), tungsten telluride ($WTe_2$), niobium sulfide ($NbS_2$), niobium selenide ($NbSe_2$), niobium telluride ($NbTe_2$), zirconium sulfide ($ZrS_2$), zirconium selenide ($ZrSe_2$), zirconium telluride ($ZrTe_2$), hafnium sulfide ($HfS_2$), hafnium selenide ($HfSe_2$), hafnium telluride ($HfTe_2$), rhenium sulfide ($ReS_2$), rhenium selenide ($ReSe_2$), rhenium telluride ($ReTe_2$), or combinations thereof. In some embodiments, the 2D material 106 is $MoS_2$. In other embodiments, the 2D material 106 is $WS_2$.

The gate dielectric 108 electrically isolates the 2D material 106 (e.g., each of the two portions of the 2D material 106) from the gates 110. The gate dielectric 108 includes two portions, each portion positioned on the sidewalls 120 of the 2D material 106 distal to the crystalline aluminum oxide 104. Each portion of the gate dielectric 108 is positioned between a gate 110 and one of the portions of the 2D material 106. The gate dielectric 108 may be formed of one or more electrically insulative materials, such as, for example, phosphosilicate glass, borosilicate glass, borophosphosilicate glass (BPSG), fluorosilicate glass, a silicon oxide (e.g., silicon dioxide), a high-K oxide (e.g., titanium dioxide, zirconium dioxide, hafnium dioxide, tantalum oxide, magnesium oxide, aluminum oxide, niobium oxide, molybdenum oxide, strontium oxide, barium oxide, yttrium oxide), a nitride material (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the gate dielectric 108 is formed of silicon dioxide.

The gates 110 may be formed of an electrically conductive material including, but not limited to, a metal (e.g., tungsten, titanium, nickel, platinum, ruthenium, aluminum, copper, molybdenum, gold), a metal-containing material (e.g., a metal nitride, a metal carbide, a metal silicide, a metal oxide), a conductively-doped semiconductor material (e.g., conductively-doped silicon, conductively-doped germanium, conductively-doped silicon germanium), polysilicon, doped polysilicon, or combinations thereof. In some embodiments, the conductive material is tungsten, titanium, tungsten nitride, or titanium nitride. The gates 110 may be configured as an access line (e.g., a word line) arranged perpendicular to the metal 102, which may be configured as a data/sense line (e.g., a bit line). While the gates 110 are illustrated as in FIG. 1A, additional gate configurations are contemplated.

As shown in FIG. 1B, the dielectric material 116 extends vertically from the top surface 118 of the metal 102 and is oriented perpendicular to the metal 102. The dielectric material 116 has a greater width than the width of the 2D material 106. The 2D material 106 is laterally adjacent to the dielectric material 116 and directly on the sidewalls 132 of the dielectric material 116. The 2D material 106 is in direct contact with the dielectric material 116 and extends along a length of the sidewalls 132 of the dielectric material 116 and along a portion of the top surface 118 of the metal 102. The dielectric material 116 is located between opposing portions of the 2D material 106. The gate dielectric 108 is laterally adjacent to the 2D material 106 and directly on the sidewalls 120 of the 2D material 106. The gate dielectric 108 is in direct contact with the 2D material 106 and extends along a length of the sidewalls 120 of the 2D material 106. The gates 110 are laterally adjacent to the gate dielectric 108 and directly on the sidewalls 122 of the gate dielectric 108. The gates 110 are in direct contact with the gate dielectric 108 and extend along a portion of a length of the gate dielectric 108. Top surfaces 124, 126, 134 of the gate dielectric 108, the 2D material 106, and the dielectric material 116 are substantially coplanar, and the lateral edges 130 of the 2D material 106 and the sidewalls 122 of the gate dielectric 108 are substantially aligned. The dielectric material 116 may be an amorphous phase dielectric material including, but not limited to, a silicon oxide ($SiO_x$), a silicon oxycarbide (SiOC), a hydrogenated SiOC (SiOCH), a hydrogenated silicon carboxide (SiCOH), or combinations thereof.

Accordingly, a transistor comprising a channel region on a material is disclosed. The channel region comprises a two-dimensional material comprising opposing sidewalls and oriented perpendicular to the material. A gate dielectric is on the two-dimensional material and gates are on the gate dielectric.

Figure 2:
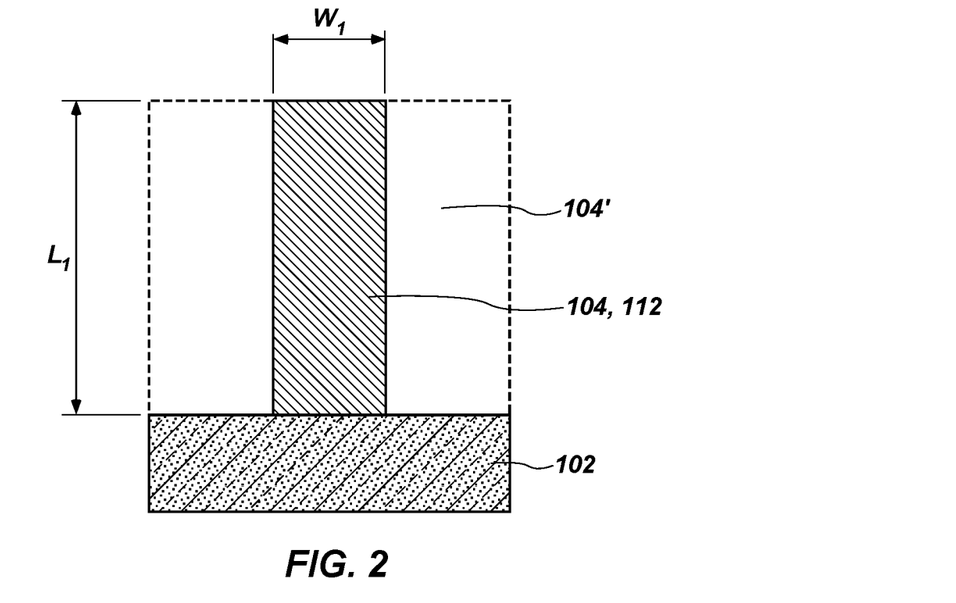
FIGS. 2-4 are cross-sectional views during stages of fabrication of the transistors in accordance with embodiments of the disclosure.

To fabricate the transistors 100, 100', a crystalline aluminum oxide material 104' (shown by dashed lines) is formed on the metal 102 and patterned, forming the pillar 112 of the crystalline aluminum oxide 104 as shown in FIG. 2. The crystalline aluminum oxide material 104' is formed on the metal 102 in a single crystal form. The metal 102 may have been previously formed on the substrate by conventional techniques. The crystalline aluminum oxide material 104' is formed on a large surface area (i.e., in a bulk amount) of the metal 102. The crystalline aluminum oxide material 104' may be formed as a blanket layer over the metal 102 and patterned by conventional photolithography techniques. By way of example only, the crystalline aluminum oxide material 104' may be formed on the metal 102 by a wafer bonding and transfer method. For instance, a bulk amount of the crystalline aluminum oxide material 104' may be formed (e.g., grown) on a carrier wafer and the crystalline aluminum oxide material 104' transferred from the carrier wafer to the substrate having the metal 102 thereon, as known in the art. In some embodiments, the substrate is a silicon-based material. The crystalline aluminum oxide material 104' may then be patterned. The crystalline aluminum oxide material 104' may also be formed on select locations of the metal 102 by the wafer bonding and transfer method, eliminating subsequent patterning acts. Alternatively, the crystalline aluminum oxide material 104' may be formed on the metal 102 by a wet process based separation layer and subsequently patterned. By using the wafer bonding and transfer method, the crystalline aluminum oxide 104 having reduced crystalline defects is formed on a large surface area of the substrate.

A portion of the crystalline aluminum oxide material 104' may be removed by conventional photolithographic techniques to form the crystalline aluminum oxide 104. For instance, the crystalline aluminum oxide material 104' may be patterned by a dry etch act. The crystalline aluminum oxide material 104' may be exposed to, for example, a dry etch chemistry selective for the crystalline aluminum oxide material 104' relative to the metal 102 and other materials of the substrate. The appropriate etch chemistry may be selected by a person of ordinary skill in the art. Removing the portion of the crystalline aluminum oxide material 104' produces the crystalline aluminum oxide 104 as the pillar 112 (e.g., line) having desired dimensions, which are indicated in FIG. 2 by length $L_1$ and width $W_1$. The crystalline aluminum oxide material 104' may also be directly formed as pillars 112 in only desired locations on the substrate.

Figure 3:
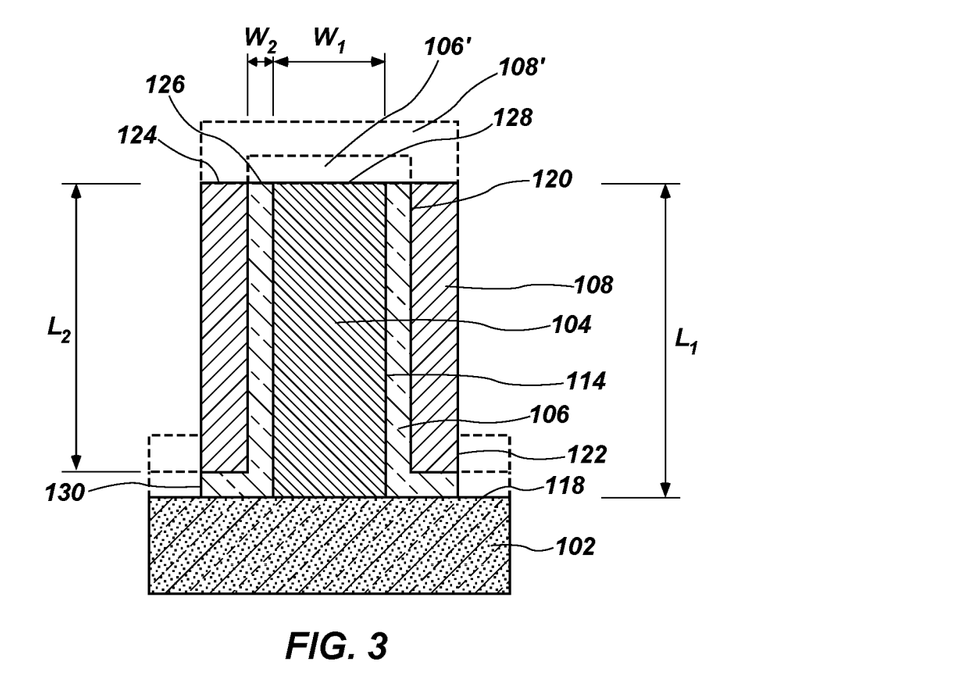

The 2D material 106' is formed over the crystalline aluminum oxide 104 and a gate dielectric material 108' is formed over the 2D material 106', as shown in FIG. 3. The 2D material 106' may be deposited or grown over the crystalline aluminum oxide 104 such that the 2D material 106' is conformally formed over the sidewalls 114 and the top horizontal surface 128 of the crystalline aluminum oxide 104 and over the top surface 118 of the metal 102. The 2D material 106' may be formed by conventional techniques, such as by CVD or ALD, at the desired width $W_2$, which substantially corresponds to the as-formed thickness of the 2D material 106'. The width $W_2$ is sufficient to provide the desired electron mobility and band gap properties for the 2D material 106 to function as the channel region while being significantly less than the width $W_1$ of the crystalline aluminum oxide 104. The 2D material 106' may be formed at a moderate temperature, such as between about 400° C. and about 600° C., to reduce or eliminate temperature incompatibilities with other, already-formed components of the semiconductor device (e.g., memory cell). The 2D material 106' formed within this temperature includes significantly reduced crystal defects than if the 2D material 106 were present in a transistor lacking the crystalline aluminum oxide 104. For instance, if the 2D material 106' were to be directly formed on a silicon-based substrate, the resulting 2D material would be of lower quality (i.e., include a greater amount of crystalline defects). Without being bound by any theory, it is believed that lattice match between the crystalline aluminum oxide 104 and the 2D material 106' reduces crystal defects by forming the 2D material 106' in its desired orientation.

The gate dielectric material 108' may be conformally formed over the sidewalls 120 and top surface 118 of the 2D material 106'. Portions (shown in dashed lines) of the 2D material 106' and the gate dielectric material 108' are removed so that top surfaces 126, 124 of the 2D material 106 and the gate dielectric 108, respectively, are substantially coplanar with the top horizontal surface 128 of the crystalline aluminum oxide 104, as shown in FIG. 3. The portions (shown in dashed lines) of the 2D material 106' on the top surface 118 of the metal 102 may also be removed, as well as overlying portions (shown in dashed lines) of the gate dielectric material 108'. Alternatively, the portion of the 2D material 106' over the top horizontal surface 128 of the crystalline aluminum oxide 104 may be removed before forming the gate dielectric material 108' over the 2D material 106' and over the top horizontal surface 128 of the crystalline aluminum oxide 104. The portion of the gate dielectric material 108' over the top horizontal surface 128 of the crystalline aluminum oxide 104 may then be removed so that the top surfaces 126, 124, respectively, of the 2D material 106 and gate dielectric 108 are substantially coplanar with the top horizontal surface 128 of the crystalline aluminum oxide 104. The horizontally oriented portions of the gate dielectric material 108' and the 2D material 106' on the top surface 118 of the metal 102 may also be removed. The portions of the 2D material 106' and the gate dielectric material 108' may be removed by conventional techniques. As shown in FIG. 3, the lateral sidewalls 122 of the gate dielectric 108 are substantially aligned with lateral edges 130 of the horizontal portion of the 2D material 106 remaining on the metal 102. A length of the 2D material 106 substantially corresponds to the length $L_1$ of the crystalline aluminum oxide 104 and a length $L_2$ of the gate dielectric 108 is less than the length $L_1$ of the crystalline aluminum oxide 104. The width $W_1$ of the crystalline aluminum oxide 104 is greater than a width $W_2$ of the 2D material 106.

Figure 4:
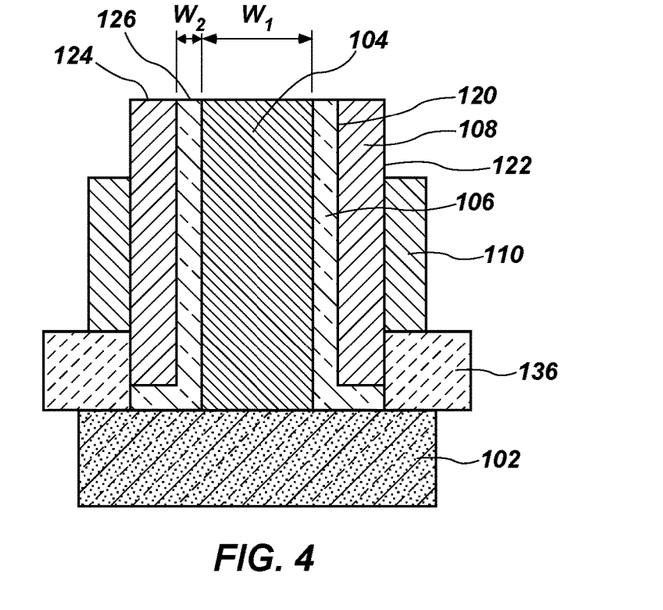

A sacrificial material is formed over the metal 102 and the gate dielectric 108, and a portion of the sacrificial material removed to form sacrificial structure 136 and recesses above the sacrificial structure 136. A gate material is formed in the recesses and a portion of the gate material removed, such as by a spacer etch process, to produce the gates 110 as shown in FIG. 4. The sacrificial structure 136 is subsequently removed, producing the transistor 100 of FIG. 1A where the gates 110 are laterally adjacent to separate portions of the gate dielectric 108, the gate dielectric 108 is laterally adjacent to each of the portions of the 2D material 106, and each of the portions of the 2D material 106 is laterally adjacent to the crystalline aluminum oxide 104. The 2D material 106 is configured as two substantially L-shaped portions, each portion laterally adjacent to and in direct contact with the sidewalls 114 of the crystalline aluminum oxide 104.

While the transistor 100 in FIG. 1A includes the crystalline aluminum oxide 104, the crystalline aluminum oxide 104 may not be present as discussed previously and illustrated in FIG. 1B. The crystalline aluminum oxide 104 may be removed by a subsequent process act. If the crystalline aluminum oxide 104 is to be sacrificial, the crystalline aluminum oxide 104 may be of lower quality than if the crystalline aluminum oxide 104 is to remain in the transistor 100. Therefore, formation conditions of the crystalline aluminum oxide 104 may be less stringent. To form the transistor 100' of FIG. 1B, the crystalline aluminum oxide 104 may be removed by conventional techniques and the dielectric material 116 formed in its place by conventional techniques. The crystalline aluminum oxide 104 may be replaced with the dielectric material 116 after forming the 2D material 106 and the gate dielectric 108 on the crystalline aluminum oxide 104 (e.g., at the stage illustrated in FIG. 3). Alternatively, the crystalline aluminum oxide 104 may be replaced with the dielectric material 116 after forming at least one of the gates 110 and the sacrificial structure 136 (e.g., at the stage illustrated in FIG. 4 or at the stage illustrated in FIG. 1B).

Accordingly, a method of forming a semiconductor device is disclosed. The method comprises forming a crystalline aluminum oxide on a material, forming a two-dimensional material over the crystalline aluminum oxide, forming a gate dielectric material over the two-dimensional material, and forming gates on the gate dielectric material. The two-dimensional material comprises opposing sidewalls separated from one another.

The transistors 100, 100' according to embodiments of the disclosure may be incorporated in memory cells, arrays including such memory cells, memory devices including such memory cells, switching devices, other semiconductor devices including such arrays, and systems including the arrays. The memory cells (e.g., volatile memory, non-volatile memory) may be used in a variety of different configurations including, but not limited to, random-access memory (RAM), read-only memory (ROM), dynamic random-access memory (DRAM), synchronous dynamic random-access memory (SDRAM), Flash memory, resistive random-access memory (ReRAM), conductive bridge random-access memory (conductive bridge RAM), magnetoresistive random-access memory (MRAM), phase change material (PCM) memory, phase change random-access memory (PCRAM), spin-torque-transfer random-access memory (STTRAM), oxygen vacancy-based memory, programmable conductor memory, ferroelectric random-access memory (FE-RAM), reference field-effect transistors (RE-FET), etc. The memory cell includes at least one transistor 100, 100' according to embodiments of the disclosure and at least one storage element 506 (e.g., a capacitor) (see FIG. 5) in operative communication with one another. The memory cells may also be stacked vertically and used in three-dimensional (3D) NAND applications. In some embodiments, the transistors 100, 100' are present in DRAM memory cells. In other embodiments, the transistors 100, 100' are present in 3D NAND memory cells.

Additional process acts may be conducted to form the semiconductor device including the transistors 100, 100', such as to form the storage element 506 and additional components of the semiconductor device. In some embodiments, the transistors 100, 100' are a vertical FET (VFET) and includes the 2D material 106 (e.g., channel region) oriented substantially perpendicular to the surface of the metal 102. The additional process acts may be conducted by conventional techniques, which are not described in detail herein. For instance, the storage element 506 and other components of the memory cell may be formed by conventional techniques.

During use and operation, the transistors 100, 100' may be selectively turned to an "on" state to allow current to pass from a source region (not shown) of the 2D material 106 to a drain region (not shown) of the 2D material 106. The transistors 100, 100' may also be selectively turned to an "off" state to substantially stop current from passing through the 2D material 106. The transistors 100, 100' and the storage element 506 are in operative communication with one another. During use and operation, a voltage is applied between the gates 110 of the transistors 100, 100' and the source region of the 2D material 106 (e.g., the channel region).

Figure 5:
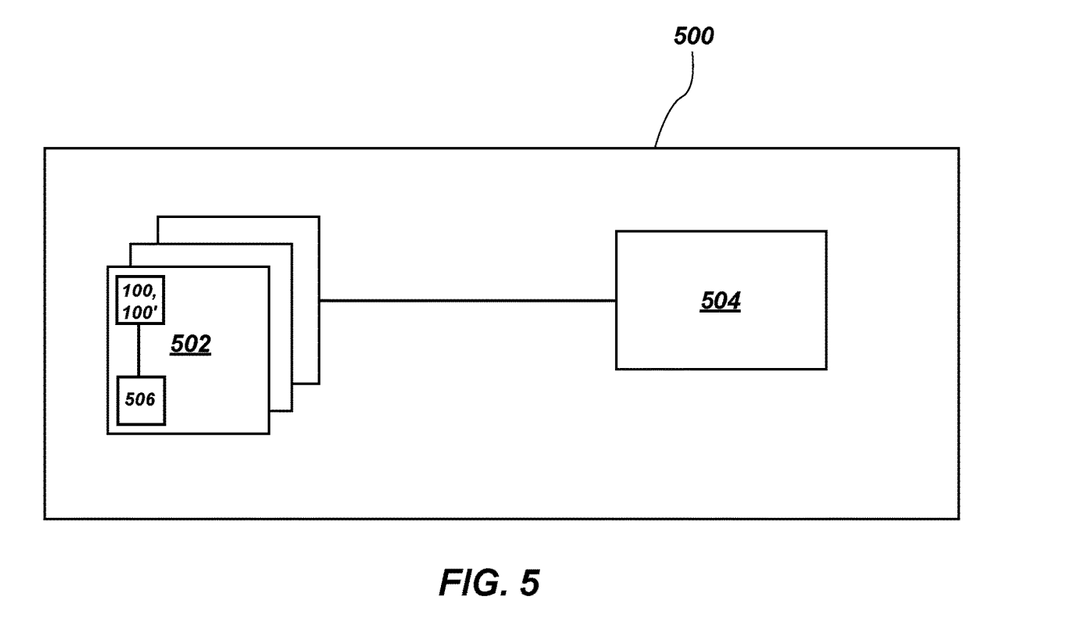
FIG. 5 is a simplified block diagram of a semiconductor device including transistors according to embodiments of the disclosure.

A simplified block diagram of a semiconductor device 500 according to embodiments of the disclosure is shown in FIG. 5. The semiconductor device 500 includes at least one memory array 502 and a control logic component 504. The memory array 502 includes arrays of memory cells including at least one or more of the transistors 100, 100' described above and one or more storage elements 506. The control logic component 504 may be configured to operatively interact with the memory array 502 so as to read, write, or re-fresh any or all of the memory cells within the memory array 502. Semiconductor devices including the transistors 100, 100' formed in accordance with embodiments of the disclosure may be formed by conducting additional process acts, which are not described in detail herein.

Accordingly, a semiconductor device comprising memory cells is disclosed. At least one memory cell of the memory cells comprises at least one vertical transistor and a storage element in operative communication with the at least one vertical transistor. The at least one vertical transistor comprises two substantially L-shaped channel regions comprising a two-dimensional material, the two substantially L-shaped channel regions comprising opposing sidewalls. A gate dielectric is on the two substantially L-shaped channel regions and gates are on the gate dielectric.

Figure 6:
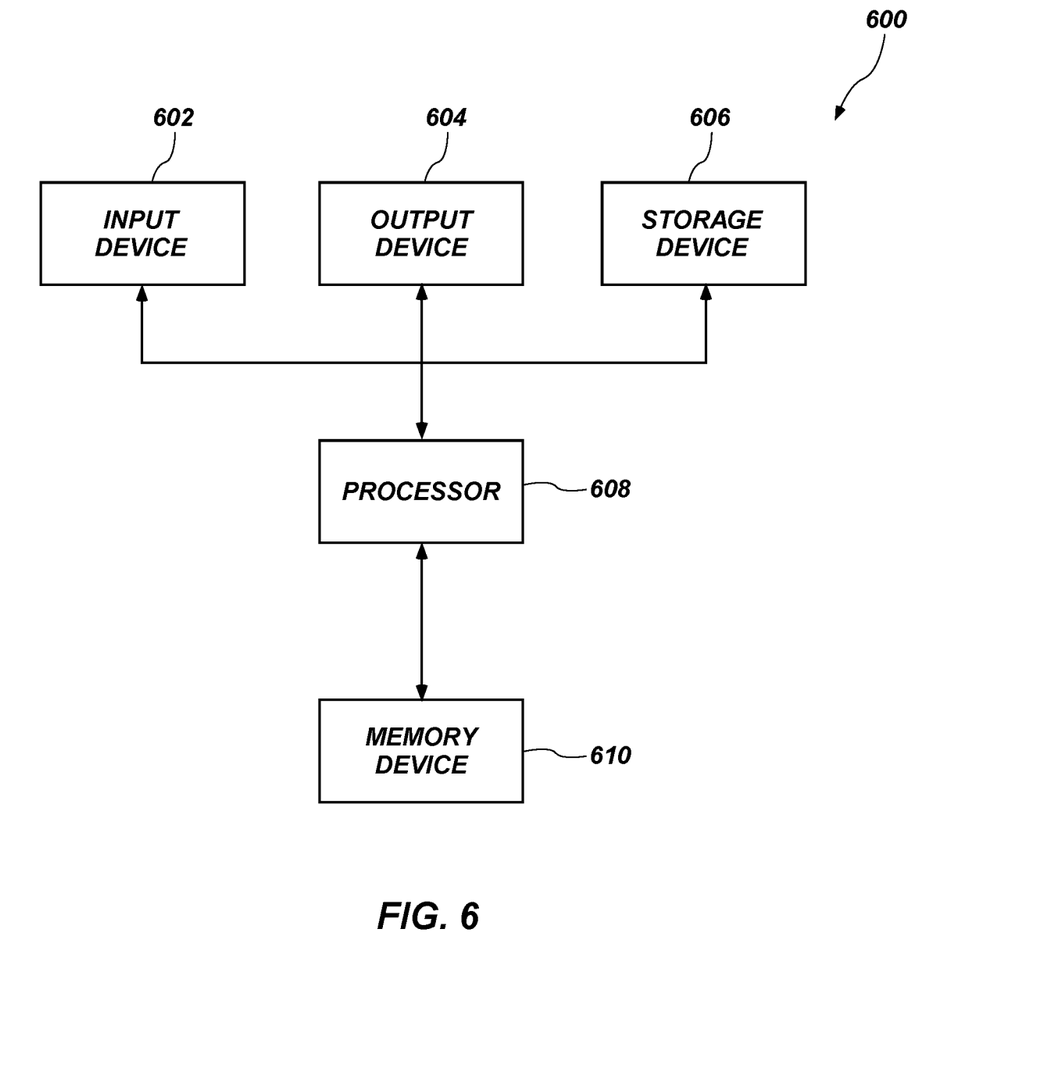
FIG. 6 is a simplified block diagram of a system including transistors according to embodiments of the disclosure.

The semiconductor devices may be used in an electronic system 600 as shown in FIG. 6. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 610, which includes the transistors 100, 100' in the memory cells of memory array 502 as previously described. The electronic system 600 may further include at least one electronic signal processor device 608 (often referred to as a microprocessor). The at least one electronic signal processor device 608 may, optionally, include at least one transistor 100, 100' as previously described. The electronic system 600 may further include one or more input devices 602 for inputting information into the electronic system 600 by a user, such as, for example, a mouse or other pointing device, a keyboard, a touchpad, a button, or a control panel. The electronic system 600 may further include one or more output devices 604 for outputting information (e.g., visual or audio output) to a user such as, for example, a monitor, a display, a touch screen, a printer, an audio output jack, a speaker, etc. In some embodiments, the input device 602 and the output device 604 may comprise a single touchscreen device that can be used both to input information to the electronic system 600 and to output visual information to a user. The one or more input devices 602 and output devices 604 may communicate electrically with at least one of the memory devices 610 and the electronic signal processor device 608. The electronic system 600 further includes a storage device 606.

Accordingly, a system comprising memory cells is disclosed. The memory cells comprise at least one transistor and a storage element in operative communication with the at least one transistor. The at least one transistor comprises a channel region comprising a two-dimensional material. The two-dimensional material comprises opposing sidewalls and the two-dimensional material comprises a width of from about one monolayer of atoms to about three monolayers and is oriented perpendicular to an underlying metal. A gate dielectric is laterally adjacent the channel region and gates are laterally adjacent the gate dielectric. A processor is in operative communication with at least one input device, at least one output device, and the memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A transistor, comprising:
   a channel region comprising a two-dimensional material on a material, the channel region comprising opposing sidewalls separated by a seed material and oriented perpendicular to the material, the seed material comprising a crystalline aluminum oxide, gallium nitride, aluminum nitride, boron nitride, graphene, or combinations thereof;
   a gate dielectric on the two-dimensional material; and
   gates on the gate dielectric.

2. The transistor of claim 1, wherein the transistor is configured in a vertical orientation.

3. The transistor of claim 1, wherein the two-dimensional material comprises a thickness of from about one monolayer to about three monolayers.

4. The transistor of claim 1, wherein a cross-section of the channel region comprises a substantially L-shape.

5. The transistor of claim 1, wherein a cross-section of the channel region comprises two portions separated from one another.

6. The transistor of claim 1, wherein the opposing sidewalls of the channel region are in direct contact with the gate dielectric.

7. The transistor of claim 1, wherein the two-dimensional material comprises a single crystalline material selected from the group consisting of a transition metal dichalcogenide (TMDC), graphene, graphene oxide, stanene, phosphorene, hexagonal boron nitride (h-BN), borophene, silicone, graphyne, germanene, germanane, a 2D supracrystal, and combinations thereof.

8. The transistor of claim 7, wherein the two-dimensional material comprises the TMDC comprising molybdenum sulfide ($MoS_2$), molybdenum selenide ($MoSe_2$), molybdenum telluride ($MoTe_2$), tungsten sulfide ($WS_2$), tungsten selenide ($WSe_2$), tungsten telluride ($WTe_2$), niobium sulfide ($NbS_2$), niobium selenide ($NbSe_2$), niobium telluride ($NbTe_2$), zirconium sulfide ($ZrS_2$), zirconium selenide ($ZrSe_2$), zirconium telluride ($ZrTe_2$), hafnium sulfide ($HfS_2$), hafnium selenide ($HfSe_2$), hafnium telluride ($HfTe_2$), rhenium sulfide ($ReS_2$), rhenium selenide ($ReSe_2$), rhenium telluride ($ReTe_2$), or combinations thereof.

9. The transistor of claim 1, wherein the opposing sidewalls are separated from one another and oriented perpendicular to the material.

10. A semiconductor device, comprising:
    memory cells, at least one memory cell of the memory cells comprising at least one vertical transistor and a storage element in operative communication with the at least one vertical transistor, the at least one vertical transistor comprising:
       two substantially L-shaped channel regions comprising a two-dimensional material, the two substantially L-shaped channel regions in direct contact with a seed material;
       a gate dielectric in direct contact with the two substantially L-shaped channel regions; and
       gates on the gate dielectric.

11. The transistor of claim 10, wherein the seed material comprises a crystalline aluminum oxide, gallium nitride, aluminum nitride, boron nitride, graphene, or combinations thereof.

12. The transistor of claim 11, wherein the seed material directly contacts each of the opposing sidewalls of the channel region.

13. The transistor of claim 11, wherein the seed material is oriented perpendicular to the material.

14. The semiconductor device of claim 10, wherein the seed material comprises a crystalline aluminum oxide material.

15. The semiconductor device of claim 14, wherein the crystalline aluminum oxide material is configured as a pillar separating the two substantially L-shaped channel regions.

16. A method of forming a semiconductor device, the method comprising:
    forming a crystalline aluminum oxide on a material;
    forming a two-dimensional material over the crystalline aluminum oxide, the two-dimensional material comprising opposing sidewalls;
    forming a gate dielectric material over the two-dimensional material; and
    forming gates on the gate dielectric material.

17. The method of claim 16, wherein forming a crystalline aluminum oxide on a material comprises forming a pillar of crystalline aluminum oxide on the material by a wafer bonding and transfer method.

18. The method of claim 17, wherein forming a pillar of crystalline aluminum oxide on the material comprises forming a crystalline aluminum oxide material on the material and patterning the crystalline aluminum oxide material.

19. The method of claim 16, wherein forming a two-dimensional material over the crystalline aluminum oxide comprises conformally forming the two-dimensional material over the crystalline aluminum oxide and forming a gate dielectric material over the two-dimensional material comprises conformally forming the gate dielectric material over the two-dimensional material.

20. The method of claim 16, further comprising removing horizontally oriented portions of the gate dielectric material and the two-dimensional material.

21. The method of claim 20, wherein removing horizontally oriented portions of the two-dimensional material comprises forming a channel region comprising two portions of the two-dimensional material separated by the crystalline aluminum oxide.

22. The method of claim 20, wherein removing horizontally oriented portions of the gate dielectric material and the two-dimensional material comprises forming sidewalls of a gate dielectric aligned with lateral edges of the two-dimensional material.

23. The method of claim 20, wherein removing horizontally oriented portions of the gate dielectric material and the two-dimensional material comprises removing the horizontally oriented portions of the gate dielectric material and the two-dimensional material such that top surfaces of the crystalline aluminum oxide, the two-dimensional material, and the gate dielectric material are substantially coplanar with one another.

24. The method of claim 23, further comprising removing the crystalline aluminum oxide.

25. The method of claim 24, further comprising forming a dielectric material in place of the removed crystalline aluminum oxide.

26. A system, comprising:
   memory cells comprising at least one transistor and a storage element in operative communication with the at least one transistor, the at least one transistor comprising:
      a channel region comprising a two-dimensional material comprising opposing sidewalls, the two-dimensional material comprising a width of from about one monolayer of atoms to about three monolayers of atoms and oriented perpendicular to an underlying metal;
      a seed material between the opposing sidewalls of the channel region;
      a gate dielectric laterally adjacent the channel region; and
      gates laterally adjacent the gate dielectric; and
   a processor in operative communication with at least one input device, at least one output device, and the memory cells.

27. The system of claim 26, wherein each of the opposing sidewalls of the channel region directly contacts a pillar of the seed material.

28. A transistor, comprising:
   a channel region comprising a two-dimensional material on a material, the two-dimensional material comprising graphene, graphene oxide, stanene, phosphorene, hexagonal boron nitride (h-BN), borophene, silicone, graphyne, germanene, germanane, a 2D supracrystal, or combinations thereof, the channel region comprising two portions of the two-dimensional material oriented substantially perpendicular to the material and top surfaces of the two portions of the two-dimensional material substantially coplanar with a top surface of a pillar material between the two portions of the two-dimensional material;
   a gate dielectric adjacent to the two-dimensional material; and
   gates adjacent to the gate dielectric.

29. The transistor of claim 28, wherein the two portions of the two-dimensional material comprise discrete portions of the two-dimensional material.

30. A transistor, comprising:
   channel regions comprising a two-dimensional material on a material, opposing sidewalls of the channel regions separated by a dielectric material and the dielectric material in direct contact with the channel regions and portions of the channel regions exhibiting a substantially L-shape in cross-section;
   a gate dielectric adjacent to the two-dimensional material, sidewalls of the gate dielectric substantially aligned with lateral edges of the channel regions; and
   gates adjacent to the gate dielectric.

31. The transistor of claim 30, wherein the dielectric material is oriented perpendicular to the material.

32. The transistor of claim 30, wherein the dielectric material is configured as a pillar separating the channel regions.

33. The transistor of claim 30, wherein the channel regions are on opposing sidewalls of the dielectric material.

34. The transistor of claim 30, wherein the portions of the channel regions exhibiting the substantially L-shape in cross-section are separated from one another.

* * * * *